United States Patent [19]

Huang

[11] Patent Number: 5,376,446
[45] Date of Patent: Dec. 27, 1994

[54] ELECTRICALLY DISSIPATIVE COMPOSITE

[75] Inventor: Hua-Feng Huang, Chadds Ford, Pa.

[73] Assignee: E. I. du Pont de Nemours and Company, Wilmington, Del.

[21] Appl. No.: 873,178

[22] Filed: Apr. 24, 1992

Related U.S. Application Data

[63] Continuation-in-part of Ser. No. 649,109, Feb. 1, 1991, abandoned.

[51] Int. Cl.$^5$ .................... H01B 1/06; B32B 7/10; C09J 7/02
[52] U.S. Cl. .................... 428/344; 428/355; 428/286; 524/495; 524/496; 252/511
[58] Field of Search ............ 428/343, 344, 354, 355; 524/495, 496; 252/511

[56] References Cited

U.S. PATENT DOCUMENTS

| | | |
|---|---|---|
| 3,257,351 | 6/1966 | Kraus et al. |
| 3,849,333 | 11/1974 | Lloyd et al. |
| 4,387,188 | 6/1983 | Statz |
| 4,395,363 | 7/1983 | Satoh et al. |
| 4,421,678 | 12/1983 | Mehta |
| 4,493,788 | 1/1985 | Fujie et al. |
| 4,550,130 | 10/1985 | Kishida et al. |
| 4,696,765 | 9/1987 | Kakizaki et al. |
| 5,055,343 | 10/1991 | Murphy .................... 428/344 |
| 5,183,591 | 2/1993 | Akahoshi et al. .......... 524/495 |

FOREIGN PATENT DOCUMENTS

| | | |
|---|---|---|
| 0219315 | 10/1986 | European Pat. Off. |
| 0419274A2 | 9/1990 | European Pat. Off. |

OTHER PUBLICATIONS

"Derwent Accession No. 90-287 686 (38), Questel Telesystems (WPIL), Derwent Publications Ltd.," London, *JP A 02 204 035 Okura Industrial KK*, Aug. 14, 1990.

*Primary Examiner*—George F. Lesmes
*Assistant Examiner*—Blaine Copenheaver

[57] ABSTRACT

A heat-sealable, oil-resistant, static-dissipative packaging composite consisting essentially of 95.5–97.5 wt % ionomer and 4.5–2.5 wt % electroconductive carbon powder having a surface area of 1000–1500 m$^2$/gm and a pore volume of 480–510 ml/100 gm. The composite is useful for protective packaging of electrostatic sensitive electronic components and assemblies.

4 Claims, No Drawings

ELECTRICALLY DISSIPATIVE COMPOSITE

CROSS REFERENCE TO RELATED APPLICATION

This application is a continuation-in-part of copending U.S. application Ser. No. 07/649,109, filed Feb. 1, 1991, now abandoned.

FIELD OF THE INVENTION

This invention relates to composites useful as electrostatic-dissipative, flexible barrier materials.

BACKGROUND OF THE INVENTION

Functional failures or manufacturability impairments of electronic components or assemblies are often attributable to damage caused by electrostatic discharge, electrostatic field force, electromagnetic radiation, moisture, oil and/or corrosive gases encountered during storage, shipment and/or processing. The problem has increased in severity in recent years, and will continue to worsen. The current trend in electronic devices and systems is towards miniaturization like VLSI (Very Large Scale Integration) chip technology. These smaller devices are more sensitive to corrosion and electrostatic damage. Yet, the demand for greater reliability is increasing. Accordingly, protection of electronic devices and systems is needed to preserve their functionality during storage, shipment and processing.

A packaging material for electrostatic discharge, electromagnetic radiation, and moisture-proof protection is disclosed by Mondano in U.S. Pat. No. 3,572,499. An aluminum foil moisture barrier, a heat-sealable carbon-filled polyethylene inner layer and a nonwoven protective outer layer are laminated together to form the Mondano packaging material. The carbon-filled polyethylene inner layer, however, will delaminate from the aluminum foil and absorb oil when contacted by oil. Additionally, excessive carbon will contaminate the parts enclosed in the package by carbon transfer and will degrade the heat seal seam strength if the layer contains carbon sufficient to achieve static-dissipative electrical surface resistivity of between $10^5$ and $10^{12}$ ohms per square. If the carbon loading in the polyethylene is reduced to obtain sufficient heat seal seam strength, the surface resistivity exceeds $10^{12}$ ohms per square and the inner surface of the package is no longer static-dissipative.

Thus, there is a need for an oil-resistant, heat sealable, humidity insensitive, electrostatic-dissipative material for packaging electronic devices and systems. It is an object of the invention to provide composites useful as heat-sealable, oil-resistant, low contamination, humidity insensitive, electrostatic-dissipative, flexible materials for packaging electrostatic discharge sensitive (ESDS) items such as microcircuits, sensitive semiconductor devices, sensitive resistors and associated higher assemblies.

SUMMARY OF THE INVENTION

The invention relates to an electrically dissipative composite free of any blowing agent and consisting essentially of 97.5–95.5 wt % ionically cross-linked thermoplastic polymer and 2.5–4.5 wt % electroconductive carbon powder having a surface area of 1000–1500 m²/gm and a pore volume of 480–510 ml/100 gm.

In a further aspect, the invention relates to an electrically dissipative package comprising a continuous, heat-sealable, flexible sheet of the above composite and optionally, a continuous layer of metal foil. In packages comprising a composite layer and a metal foil layer, the composite layer is adhered to the face of the metal foil layer that constitutes the inner surface of the package.

DETAILED DESCRIPTION OF THE INVENTION

Ionically cross-linked thermoplastic polymers or ionomers are the substrate polymer used in this invention. Preferred ionomers are ethylene organic acid copolymers partly neutralized with metallic ions such as potassium, lithium, sodium and zinc. Particularly preferred ionomers are disclosed by Rees in U.S. Pat. No. 3,264,272 and sold under the name Surlyn ® by E. I. du Pont de Nemours and Company (Wilmington, Del.). These Rees ionomers comprise a polymer of an α-olefin having the general formula $RCH=CH_2$ where R is a radical selected from the class consisting of hydrogen and alkyl radicals having from 1 to 8 carbon atoms, the olefin content of said polymer being at least 50 mol percent based on the polymer, and an $\alpha,\beta$-ethylenically unsaturated carboxylic acid having 1 or 2 carboxylic acid groups, the acid monomer content of said polymer being from 0.2 to 25 mol percent based on the polymer, said carboxylic-acid containing polymer containing uniformly distributed throughout the polymer, one or more metal ions having ionized valences of 1 to 3 inclusive where the acid comonomer is monocarboxylic, and an ionized valence of one where the acid comonomer is dicarboxylic, the quantity of the metal ion being sufficient to neutralize at least 10 percent of the carboxylic acid.

The electroconductive carbon powder used in the invention has a surface area of 1000–1500 m²/gm and a pore volume of 480–510 ml/100 gm. Preferably, the carbon powder has a surface area of about 1250 m²/gm and a pore volume of about 495 ml/100 gm. Particularly preferred is Ketjenblack ® EC600JD, marketed by Akzo Chemie America (Chicago, Ill.).

When the weight percent loading of the carbon powders used in this invention falls below 5 in common base polymers such as EVA (ethylene-vinyl acetate), ABS (acrylonitrile-butadiene-styrene), HDPE (high density polyethylene), LDPE (low density polyethylene), and SBR (styrene-rubber), the electrical volume resistivity rises steeply. Therefore, these carbon powders have not been used in static-dissipative thermoplastic materials which require a thin film (i.e., 0.5 mil–5 mils) surface resistivity in the range of $10^5$ to $10^{12}$ ohms per square. Also, when a blowing agent is present in the composite, the final structure being a foam, a carbon weight percent in the composite of less than 5 likewise has a surface resistivity greater than the $10^5$ to $10^{12}$ ohms per square range. Nonetheless, applicants have found that when an ionomer resin is compounded with 2.5–4.5 wt % of the carbon powder of this invention, particularly Ketjenblack ® EC600JD, the two components work together to enable better control of the surface resistivity of the final-blend non-foamed film (e.g., 0.5 mil–5 mils) to within the static dissipative range (e.g., $10^5$ to $10^{12}$ ohms per square, more preferably $10^6$ to $10^{10}$ ohms per square at or below an ambient humidity of 12%). Carbon particle emission and transfer when rubbed against a clean surface is also substantially reduced. It was surprising that the ionomer/carbon compositions of the invention had such advantageous properties in the absence of elemental metal, such as copper.

The ionomer resin and carbon powder can be compounded by blending with a twin-screw extruder, a continuous mixer, or a batch mixer to achieve thorough mixing at a melt temperature of 160°–195° C. A low blending melt temperature tends to yield poor dispersion of carbon into the ionomer resin resulting in slightly higher volume resistivity. The melt index of the ionomer resin should be selected so that the melt index of the blended resin/carbon falls in the range of 1–20 decigrams/min.

Monolayer packaging material comprising a resin and carbon powder film can be produced by extruding a resin/carbon blend into a film. Typically, the blend is extruded at a melt temperature of 180°–240° C. Extrusion at melt temperatures higher than 240° C. can overheat the carbon particles causing blisters or streaks in the film surface. Extrusion at temperatures lower than 180° C. produces films having unsatisfactorily high electrical resistivities. The resultant film has oil resistance, humidity insensitivity, low contamination, permanent electrostatic-dissipative functional performance and superior heat-sealability. "Permanent electrostatic dissipative functional performance" means that films of this invention do not lose their static dissipative performance, as compared to films which have volatile organic antistatic additives. Superior heat-sealability is characterized by a wider range of heat seal temperatures (e.g., 160°–200° C.) and a seam strength of greater than 1590 grams/inch.

Multilayer packaging material can be produced by a number of different methods. In one method an intermediate or adhesive layer of ionomer resin is extruded at a melt temperature of 240°–300° C. between an ionomer/carbon blend film and a metal foil or metal foil laminate using an extrusion laminator. An extrusion melt temperature lower than 240° C. will result in inadequate bond strength between the foil and the film. An extrusion melt temperature above 300° C. will cause resin degradation.

In another method, multilayer packaging material can be produced by laminating at a lamination interface temperature of 80°–160° C. an ionomer/carbon film with an intermediate layer of ionomer film onto a surface of a metal foil or a metal foil laminate by passing the webs through a heated nip in a thermal laminator. A lamination interface temperature of less than 80° C. results in inadequate bond strength between the foil and the film. A lamination interface temperature of greater than 160° C. causes the preblended ionomer/carbon film to melt thereby deteriorating the surface resistivity of the film.

A third method produces multilayer packaging material by the sequential application of the ionomer adhesive layer and the ionomer/carbon blend composite. An adhesive layer of the ionomer resin at a melt temperature of 240°–300° C. can be extruded directly on to a metal foil or metal foil laminate followed by the extrusion of a surface layer of ionomer/carbon blend composite at a melt temperature of 180°–240° C.

In a fourth method, multilayer packaging material can be produced by coextruding a coating of ionomer/carbon blend composite with an adhesive layer of ionomer resin directly on to a metal foil or metal foil laminate, using sufficient temperature and pressure to adhere the coating without degrading the surface resistivity of the resultant laminate.

And in yet another method, multilayer packaging material can be produced by extrusion coating an ionomer/carbon blend composite directly on to a metal foil or metal foil laminate, using sufficient temperature and pressure to adhere the composite directly to the foil without the need for an intermediate or adhesive layer.

The metal foil imparts to the packaging laminate EMI (electromagnetic interference) shielding and moisture vapor barrier properties. A metal foil laminate comprises a metal foil layer having secured to one face a layer of protective material which ultimately forms the outside of the package. The layer of protective material may be any material suitable for protecting the metal layer and giving strength and body to the packaging laminate. Examples of protective material include woven, knitted, extruded or nonwoven sheets such as Kraft paper, nylon films, polyester films, and coated and uncoated bonded nonwoven sheets of polyolefin film-fibrils of the type disclosed in Steuber, U.S. Pat. No. 3,169,899. A commercial polyethylene film-fibril sheet product sold by E. I. du Pont de Nemours and Company (Wilmington, Del.) under the name Tyvek®, organic anti-star coated Tyvek®, and vacuum metallized Tyvek® are particularly suitable. Tyvek® bonded nonwoven polyethylene film-fibril sheets are lightweight and have outstanding mechanical properties such as puncture and tear strength, while also having good tolerance to ordinary weather conditions.

Ionomer/carbon monolayer films and multilayer laminates can be used as a wrapping material or formed into packages, such as bags. For example, two sheets of the multilayer laminate having their respective ionomer/carbon layers facing and contacting each other can be heat sealed together to form a bag by applying heat and pressure along their marginal edges using any of the procedures well known in the art. In addition to the EMI-shielding and moisture barrier properties of the metal foil layer, the resultant bag has an ionomer/carbon blend film inner surface that exhibits a broad heat-seal temperature window, high heat seal seam strength, oil resistance, humidity insensitivity, low contamination, and permanent electrostatic-dissipative functional performance.

The following examples further illustrate the production and performance of the composites and packaging material of the invention. Unless otherwise specified, amounts are in weight percent. Properties measured and measurement methods are listed below:

| Property | Measurement Method |
| --- | --- |
| Surface Resistivity | ASTM D-257 |
| | Sample films are conditioned |
| | in a glove box maintained at |
| | specified ambient relative |
| | humidities at room temperature |
| | for 24 hours before measurement. |
| Heat-Seal Strength | 1" Flat Bar Sealer |
| | 400° F. (204° C.) bar temperature. |
| | 4-seconds dwell time |
| | 40 psi bar pressure |
| | The seam strength was |
| | measured with an Instron. |
| | The reported value is the |
| | average of three measurements. |
| Oil-Resistance | Federal Test Method 3015.1 |
| | and Military Specification |
| | MIL-B-81705C of 25 January |
| | 1989 |
| Melt Index | ASTM D-1238. The melt-flow- |

Comparative Example

Seven percent by weight of Ketjenblack ® EC600JD was melt-blended into 93% by weight of Surlyn ® 1702 resin (a zinc ionomer derived from ethylene/methacrylic acid copolymers partially neutralized with zinc cations, having a melt index 16.2 decigrams/min., a density of 0.94 gms/cc, and melting point of 86° C. (manufactured by E. I. du Pont de Nemours & Company, Inc., Wilmington, Del.), with a 28 millimeter twin-screw extruder (Werner & Pfleiderer, Stuttgart, Germany) at a melt temperature of 191° C. The melt-blend was extruded into a ⅛" diameter strand and water-quenched and pelletized (melt-index=0.3 decigrams/min.).

The pellets were subsequently melt-extruded in a 1" Wayne table-top single-screw extruder (Wayne Machine and Die Company, Totowa, N.J.) and cast into a film with a 6" horizontal film die. The cast film was quenched on a 3-roll finisher. The resultant film was tested for surface resistivity per ASTM D-257 at 12% ambient relative humidity.

| Sample | Melt Temp (°C.) | Extruder Output (RPM) | 3-Roll Finisher Temperature | | | Film Take-Off Speed (FPM) | Film Thickness (mils) | Surface Resistivity @12% RH (Ohms/square) |
| --- | --- | --- | --- | --- | --- | --- | --- | --- |
| | | | #1 (°C.) | #2 (°C.) | #3 (°C.) | | | |
| Comp. Ex. | 201–205 | 30 | 35 | 35 | 35 | 3.5 | 24 | $1.3 \times 10^5$ |

The surface resistivity was marginally low for static-dissipative application. The concentration of carbon blended into the ionomer resin was too high.

Example I

Fifty-seven (57) percent by weight of the 7% Ketjenblack ® EC600JD/93% Surlyn ® 1702 pellets (melt-index=0.3 decigrams/min.) of the Comparative Example was melt-blended into 43% by weight of Surlyn ® 1702 (melt-index=16.2 decigrams/min.) with a 28 millimeter twin-screw extruder (Werner & Pfleiderer, Stuttgart, Germany) at a melt temperature of 187° C. to obtain a final 4% Ketjenblack ® EC600JD/96% Surlyn ® 1702 blend. The melt-blend was extruded into a ⅛" diameter strand and water-quenched and pelletized (melt-index=6.9 decigrams/min.).

The pellets were subsequently melt-extruded in a 1" Wayne table-top extruder (Wayne Machine and Die Company, Totowa, N.J.) and cast into a film with a 6" horizontal film die. The cast film was quenched on a 3-roll finisher. The extruder-output and the film take-off speed were adjusted to control the resultant film thickness. The resultant films were tested for Surface Resistivity per ASTM D-257 at 50% ambient relative humidity.

Both films (1.5 mil thick and 4.0 mil thick) were static dissipative as shown by their surface resistivity values which were not only within the range of $10^5$ to $10^{12}$ ohms/square but also within the preferred range of $10^6$ to $10^{10}$ ohms/square. Contamination properties of the films were tested by rubbing the inner surface of the resultant film to a white Xerox paper surface and the films showed no carbon transfer.

| Sample | Melt Temp (°C.) | Extruder Output (RPM) | 3-Roll Finisher Temperature | | | Film Take-Off Speed (FPM) | Film Thickness (mils) | Surface Resistivity @50% RH (Ohms/square) |
| --- | --- | --- | --- | --- | --- | --- | --- | --- |
| | | | #1 (°C.) | #2 (°C.) | #3 (°C.) | | | |
| IA | 195 | 15 | 30 | 30 | 30 | 16 | 1.5 | $3.4 \times 10^8$ |
| IB | 195 | 15 | 30 | 30 | 30 | 8 | 4.0 | $2.1 \times 10^7$ |

Example II

Packaging laminates with a carbon/ionomer blend inner surface were made by laminating a carbon/ionomer blend film with an intermediate layer of an ionomer film onto the inner surface of an aluminum foil of an EMI shielding and moisture-barrier laminate. An Inta-Roto 24" film-laminator (Inta-Roto Machine Company, Model LCL18, Richmond, Va.) was used for thermal lamination.

A 2-mil MD230 O-dry ("A" wettable) aluminum foil (made by Reynolds Metals Company, Richmond, Va.) was first preheated in the drying tunnel at 100° F. (37.8° C.). The preheated foil was further heated by the chrome-surface hot-roll (heated by 190° F. (87.8° C.) circulating oil) and laminated with a 2-mil ionomeric film manufactured by Flex-O-glass, Inc., Chicago, Ill. prepared from Surlyn ® 1605 ionomer resin (a sodium ionomer derived from ethylene/methacrylic acid copolymers partially neurtralized with sodium cations, having a melt index of 2.8 decigrams/min., a density of 0.95 gms/cc, and melting point of 86° C., manufactured by E. I. du Pont de Nemours & Co., Inc. Wilmington, Del.) on the Teflon ®-covered rubber nip roll side at the combining roll section. The nip pressure used was 100 psi. The laminate was then chilled (45° F. (7.2° C.) chill roll temperature) and wound-up. The film and laminate speed was 25 feet per minute. The web tension was kept low to prevent film stretching.

The ionomer/foil laminate was fed through the laminator a second time and preheated in the drying tunnel at 100° F. (37.8° C.). The preheated laminate was further heated by the chrome-surface hot-roll (heated by 190° F. (87.8° C.) circulating oil) with the foil side contacting the hot-roll and laminated with the carbon/ionomer blended film made in Example I on the Teflon ®-covered rubber nip roll side. The nip pressure used was 100 psi. The laminate was then chilled (45° F. (7.2° C.) chill roll temperature) and wound-up. The film and laminate speed was 25 feet per minute. The web tension was again kept low.

The laminates were tested for Surface Resistivity at 12% ambient relative humidity (ASTM D-257), Oil-Resistance (FTM 3015.1), and Heat Seal Strength.

| Laminate Sample Number | Film Sample Number | After-Lamination Laminate Thickness (mils) | Surface Resistivity @12% RH (Ohms/square) | Oil Resistance Test | Heat-Seal Seam Strength (gms/inch) |
|---|---|---|---|---|---|
| IIA | IA | 7.9 | 3.7 × 10^10 | Pass | 11,912 |
| IIB | IB | 10.6 | 4.8 × 10^7 | Pass | 15,328 |

The resultant inner surface of the film/aluminum foil laminates were static dissipative as shown by their surface resistivity values which were within the range of $10^5$ to $10^{12}$ ohms/square. Further, the laminates demonstrate good oil resistance and have very good heat-seal seam strength (i.e., all having values much greater than the industry standard of 1,590 grams/inch which is also required to meet Military Specification MIL-B-81705C Jan. 25, 1989)). Contamination properties of the film were tested by rubbing the inner surface of the resultant laminate to a white Xerox paper surface showed no carbon transfer.

Example III

Three ionomer/Ketjenblack® EC600JD carbon blends (3.0% carbon/97% Surlyn® 1702, 3.5% carbon/96.5% Surlyn® 1702, and 4.0% carbon/96% Surlyn® 1702) were made by feeding Ketjenblack® EC600JD volumetrically from a K-Tron Twin-Screw Feeder (K-Tron Corporation, Pitman, N.J.) and feeding Surlyn® 1702 from a K-Tron Weight-In-Loss Single Screw Feeder (K-Tron Corporation, Pitman, N.J.) into the continuous mixer portion of a Farrel Compact Processor (using #7 blades)(Model CP-23 Farrel Machine Company, Ansonia, Conn.). The hot feed extruder portion received the continuous discharge from the mixer and extruded each blend through a die into four ⅛-inch diameter strands. The four strands were subsequently water-quenched and pelletized. Mixing conditions are listed in the table below.

| Sample Blend # | Surlyn® 1702 (%) | Ketjenblack® EC600JD (%) | Mixer RPM (RPM) | Rate (PPH) | Chamber Temp. (°C.) | Orifice Setting | Melt Temp (°C.) | Melt Index (decigrams/min) |
|---|---|---|---|---|---|---|---|---|
| IIIA | 97.0 | 3.0 | 350 | 100 | 140 | 7.0 | 171 | 9.8 |
| IIIB | 96.5 | 3.5 | 350 | 100 | 140 | 7.0 | 169 | 9.2 |
| IIIC | 96.5 | 3.5 | 350 | 50 | 150 | 9.5 | 176 | 9.8 |
| IIID | 96.5 | 3.5 | 350 | 75 | 150 | 9.5 | 177 | 8.3 |
| IIIE | 96.5 | 3.5 | 350 | 100 | 150 | 9.5 | 176 | 9.1 |
| IIIF | 96.5 | 3.5 | 550 | 100 | 150 | 9.5 | 168 | 9.3 |
| IIIG | 96.5 | 3.5 | 350 | 100 | 150 | 7.5 | 172 | 9.2 |
| IIIH | 96.5 | 3.5 | 500 | 100 | 150 | 7.5 | 174 | 8.7 |
| IIIJ | 96.0 | 4.0 | 350 | 75 | 150 | 9.5 | 169 | 8.0 |
| IIIK | 96.0 | 4.0 | 350 | 100 | 150 | 9.5 | 168 | 8.4 |
| IIIL | 96.0 | 4.0 | 350 | 100 | 150 | 7.5 | 173 | 8.0 |
| IIIM | 96.0 | 4.0 | 500 | 100 | 150 | 7.5 | 174 | 8.4 |

The pellets were subsequently melt extruded in a 1" Wayne table-top single screw extruder (Wayne Machine and Die Company, Totowa, N.J.) and cast into a film with a 6" horizontal film die. The cast film was quenched on a 3-roll finisher. Film casting conditions are listed in the table below:

| Sample Film # | Melt Temp. (°C.) | Extruder RPM (RPM) | 3-Roll Finisher Temperature #1 (°C.) | #2 (°C.) | #3 (°C.) | Film Takeoff Speed (FPM) | Film Thickness (mils) |
|---|---|---|---|---|---|---|---|
| IIIA.1 | 170 | 19 | 58 | 58 | 53 | 12.5 | 2.0 |
| IIIA.2 | 190 | 19 | 58 | 58 | 53 | 12.5 | 2.0 |
| IIIG.1 | 170 | 19 | 53 | 53 | 53 | 2.5 | 2.0 |
| IIIB.1 | 170 | 19 | 53 | 53 | 53 | 2.5 | 2.0 |
| IIIB.2 | 190 | 19 | 58 | 58 | 53 | 2.5 | 2.0 |
| IIIC | 185 | 19 | 70 | 70 | 35 | 2.5 | 2.0 |
| IIID | 185 | 18 | 66 | 66 | 34 | 2.5 | 2.0 |
| IIIE | 190 | 18 | 55 | 55 | 34 | 2.5 | 2.0 |
| IIIF | 190 | 18 | 55 | 55 | 34 | 2.5 | 2.0 |
| IIIG.2 | 190 | 18 | 55 | 55 | 34 | 2.5 | 2.0 |
| IIIH | 190 | 18 | 55 | 55 | 34 | 2.5 | 2.0 |
| IIIJ.1 | 190 | 19 | 55 | 55 | 34 | 12.5 | 2.0 |
| IIIK | 190 | 18 | 55 | 55 | 34 | 12.5 | 2.0 |
| IIIM | 190 | 19 | 55 | 55 | 34 | 12.5 | 2.0 |
| IIIJ.2 | 240 | 23 | 30 | 30 | 34 | 12.5 | 2.0 |

The surface resistivity was measured using ASTM D-257 after the resultant films were conditioned for 24 hours in 5%, 12%, and 50% ambient relative humidity at room temperature (22.2° C.).

| Sample Film # | Film Thickness (mils) | Log of Surface Resistivity in ohms/square 5% R.H. Side 1 | Side 2 | 12% R.H. Side 1 | Side 2 | 50% R.H. Side 1 | Side 2 |
|---|---|---|---|---|---|---|---|
| IIIA.1 | 2.0 | 15.5 | 15.1 | 16.2 | 15.9 | 16.0 | 15.1 |
| IIIA.2 | 2.0 | 16.4 | 16.4 | 18.0 | 16.8 | 15.4 | 15.2 |
| IIIG.1 | 2.0 | 14.6 | 13.6 | 14.3 | 13.7 | 14.3 | 14.3 |
| IIIB.1 | 2.0 | 15.9 | 15.7 | 16.2 | 15.9 | 15.2 | 15.2 |
| IIIB.2 | 2.0 | 7.8 | 7.8 | 8.0 | 7.8 | 7.8 | 7.5 |
| IIIC | 2.0 | 8.9 | 8.6 | 8.6 | 8.3 | 8.9 | 8.2 |
| IIID | 2.0 | 6.7 | 6.6 | 6.6 | 6.5 | 6.5 | 6.4 |
| IIIE | 2.0 | 7.3 | 7.2 | 7.1 | 6.9 | 7.0 | 6.5 |
| IIIF | 2.0 | 7.5 | 7.5 | 7.5 | 7.3 | 7.4 | 7.2 |
| IIIG.2 | 2.0 | 7.0 | 7.0 | 7.0 | 6.8 | 6.7 | 6.6 |
| IIIH | 2.0 | 7.1 | 7.0 | 6.8 | 6.8 | 7.0 | 6.8 |
| IIIJ.1 | 2.0 | 6.4 | 6.4 | 6.3 | 6.3 | 6.3 | 6.2 |
| IIIK | 2.0 | 6.3 | 6.3 | 6.3 | 6.2 | 6.4 | 6.2 |
| IIIM | 2.0 | 6.5 | 6.4 | 6.6 | 6.3 | 6.3 | 6.3 |

-continued

| | Film Thick- | Log of Surface Resistivity in ohms/square | | | | | |
|---|---|---|---|---|---|---|---|
| | | 5% R.H. | | 12% R.H. | | 50% R.H. | |
| Sample Film # | ness (mils) | Side 1 | Side 2 | Side 1 | Side 2 | Side 1 | Side 2 |
| IIIJ.20 | 2.0 | 5.6 | 5.5 | 5.6 | 5.5 | 5.7 | 5.6 |

The surface resistivity of the static dissipative film of this invention did not change significantly with ambient relative humidity. Thus, these materials will function over a wide range of ambient relative humidity (i.e., they are humidity insensitive).

Example IV

The pellets of Blend #IIIB (3.5% Ketjenblack® EC600JD and 96.5% Surlyn® 1702) were melt-extruded with a 2.5" single screw extruder, (manufactured by Sterling Extruder Corporation, Linden, N.J.) and cast into a 60-inch wide, and 2-mil thick film with a coat-hanger-design film die. The film takeoff and windup system was manufactured by Johnson Plastics Machinery, Chippewa Falls, Wis.

Extrusion conditions are as follows:

| EXTRUDER-ZONES TEMP (°C.) | | | | DIE-ZONES TEMP (°C.) | | | | | BARREL °C. | DIE ADAP °C. | EXTR UDER RPM | FILM TAKE OFF FPM | CHROME TEMP CTR | ROLL (°F.) BOTT. |
|---|---|---|---|---|---|---|---|---|---|---|---|---|---|---|
| 1 | 2 | 3 | 4 | 1 | 2 | 3 | 4 | 5 | | | | | | |
| 198 | 198 | 204 | 200 | 185 | 182 | 181 | 185 | 183 | 180 | 180 | 30 | 10 | 65 | 60 |

Nine 4-inch diameter circular samples were taken across the 60 inch width of the last feet of the film. The nine 4-inch diameter circular samples were conditioned 24 hours at 12% ambient relative humidity and room temperature and their surface resistivity and film thickness profiles were measured using the test methods stated above.

| POSITIONS OF THE CENTER OF 4" DIA SAMPLES FROM LEFT | 4" | 11.5" | 18" | 25" | 31" | 37" | 43.5" | 49" | 54" |
|---|---|---|---|---|---|---|---|---|---|
| LOG (OF) SURFACE RESISTIVITY IN OHMS/SQUARE | | | | | | | | | |
| SIDE #1 | 13.1 | 14.3 | 8.6 | 6.9 | 7.0 | 9.1 | 12.1 | 12.1 | 13.4 |
| SIDE #2 | 15.0 | 15.9 | 8.3 | 6.7 | 6.9 | 8.8 | 14.4 | 14.5 | 13.2 |
| THICKNESS (mil) | 2.0 | 2.4 | 2.2 | 2.3 | 2.0 | 2.0 | 2.3 | 2.5 | 1.9 |

The center 23-inch width portion of the film was static dissipative as shown by the surface resistivity values which were between $10^{6.7}$ to $10^{9.1}$ ohms/square after 24 hour conditioning in a 12% ambient relative humidity at room temperature.

Example V

The center 23 inch portion of the film of Example IV was slit into a new 23 inch wide film roll. A 24-inch wide flat coextrusion line custom built by SANO Inc. (A subsidiary of Cincinnati Milacron, Inc. Cincinnati, Ohio) was used for extrusion-lamination. For this experiment, only one layer-slot of the multilayer coextrusion die was left open.

Fresh resin of Surlyn® 1702 was melt extruded into 19-inch wide, 1.0 mil thick adhesive layer between the 23 inch wide 2-mil thick Ketjenblack® EC600JD/Surlyn® 1702 blend film of Example IV on the water-cooled chilled roll side and a 24-inch wide, 2 mil thick O-dry surface aluminum foil on the nip-roll side. The laminating conditions of the two 100-feet laminate samples made were:

| LAMINATE SAMPLE # | EXTRUDER MELT TEMP | SCREW RPM | HEAD PRESSURE (PSI) | HEAD TEMP | LAMINATOR CHILL ROLL-TEMP | LINE SPEED (FPM) |
|---|---|---|---|---|---|---|
| V-A | 478 F. (247.8 C.) | 36 | 543 | 475 F. (246.1 C.) | 80 F. (26.7 C.) | 200 |
| V-B | 425 F. (218.3 C.) | 51 | 1440 | 425 F. (218.3 C.) | 80 F. (26.7 C.) | 200 |

The two laminate samples were edge-trimmed to produce a 19-inch width center. Three 4-inch diameter circular samples (left-edge, center, and right-edge) were taken from each of the two laminate samples. After conditioning for 24 hours in a 12% ambient relative humidity at room temperature, the surface resistivity of the carbon/ionomer blend film surface of the six 4-inch diameter circular laminate samples were measured.

| LAMINATE SAMPLE # | LOG OF SURFACE RESISTIVITY IN OHMS/SQUARE | | |
|---|---|---|---|
| | LEFT-EDGE | CENTER | RIGHT-EDGE |
| V-A | 8.4 | 7.2 | 7.7 |
| V-B | 7.2 | 7.0 | 8.3 |

The surface resistivity was between $10^{6.7}$ to $10^{9.1}$ ohms/square before lamination; and between $10^{7.0}$ to $10^{8.4}$ ohms/square after extrusion lamination. These results showed that the surface resistivity was not affected significantly by the extrusion lamination condition used in this experiment. They are all within the static dissipative range of $10^5$ to $10^{12}$ ohms/square.

Heat seal seam strength of the two laminate samples were measured to show the superior heat seal performance of the film-laminate of this invention. The sealing conditions are 4 second dwell time, bar temperature as noted, 40 psi bar pressure, 1-inch wide hot bar.

| | HEAT SEAL SEAM STRENGTH | | |
|---|---|---|---|
| SEALING TEMPERATURE | SEAM STRENGTH SAMPLE # V-B (gms/in) | SEAM STRENGTH SAMPLE # V-A (gms/in) | TYPE OF SEAL FAILURE |
| 200 F. (93.3 C.) | 5,311 | 1,861 | Peel |
| 250 F. (121.1 C.) | 8,671 | 7,854 | Laminate breaks |
| 300 F. (148.9 C.) | 10,215 | 5,947 | Laminate breaks |
| 350 F. (176.7 C.) | 9,534 | 8,944 | Laminate breaks |
| 400 F. (204.4 C.) | 10,170 | 9,806 | Foil breaks then film peels from foil |

A heat-seal seam strength of 1,590 grams/inch is considered good by industrial packaging standards and is required by Military Specifications (MIL-B-81705C (Jan. 25, 1989)). These data show that film-laminates of this invention have a very wide window (200 to 400 degrees F. or 93.3 to 204.4 degrees C.) of heat seal temperature and a very high heat seal seam strength.

The resistance to ASTM #3 oil of the two laminate samples were also tested in accordance with the Federal Test Method 3015. The results are shown below:

| LAMINATE SAMPLE | Lamination Melt Temperature | Pass or Fail | Observations |
|---|---|---|---|
| V-A | 475 F. (246.1 C.) | Pass | |
| V-B | 425 F. (218.3 C.) | Fail | Blisters |

An extrusion-lamination temperature of 475 degrees F. (246.1 degrees C.) provided sufficient adhesion to pass the Federal Test Method 3015 ASTM #3 Oil Delamination Test when one-mil thick Surlyn® 1702 is used as the adhesive layer between carbon/ionomer blend film and aluminum foil. The lower lamination temperature of 218.3° C. used to produce laminate sample V-B provided inadequate bond strength between the foil and adhesive layer.

We claim:

1. An electrically dissipative package for protecting electrostatic-discharge sensitive items, said package comprising a continuous layer of metal foil and a heat-sealable, flexible sheet of an electrically dissipative composite blend free of any blowing agent, and consisting essentially of 97.5–95.5 wt % ionomer, and 2.5–4.5 wt % electroconductive carbon powder having a surface area of 1000–1500 m²/gm and a pore volume of 480–510 ml/100 gm, the flexible sheet being adhered to one face of the metal foil layer, which face constitutes the inside of the package.

2. The electrically dissipative package of claim 1 wherein the ionomer of the composite blend comprises ethylene-acid polymer partly neutralized with metallic ions.

3. The electrically dissipative package of claim 2 wherein the carbon powder has a surface area of about 1250 m²/gm and a pore volume of about 495 ml/100 gm.

4. An electrically dissipative package for protecting electrostatic-discharge sensitive items, said package comprising a continuous protective layer of a bonded nonwoven polyethylene film-fibril and a heat-sealable, flexible sheet of an electrically dissipative composite blend free of any blowing agent, and consisting essentially of 97.5–95.5 wt % ionomer, and 2.5–4.5 wt % electroconductive carbon powder having a surface area of 1000–1500 m²/gm and a pore volume of 480–510 ml/100 gm, the flexible sheet being adhered to one face of the protective layer, which face constitutes the inside of the package.

* * * * *